United States Patent [19]

Fujisono et al.

[11] Patent Number: 5,404,475
[45] Date of Patent: Apr. 4, 1995

[54] MEMORY APPARATUS COMPRISING MEMORY CARDS WITH A SIDE DETECTING SIGNAL PIN AND ADDRESS ASSIGNMENT CIRCUITRY

[75] Inventors: Kenji Fujisono; Kazuo Sumitani; Yoso Igi, all of Kawasaki; Fumiaki Tahira, Yokohama; Keiko Kawasaki, Tokyo, all of Japan

[73] Assignee: Fujitsu Limited, Kawasaki, Japan

[21] Appl. No.: 830,523

[22] Filed: Feb. 3, 1992

Related U.S. Application Data

[63] Continuation of Ser. No. 495,984, Mar. 20, 1990, abandoned.

[30] Foreign Application Priority Data

Mar. 20, 1989 [JP] Japan ..................................... 1-66249

[51] Int. Cl.⁶ ..................... G06F 12/00; G06F 13/00; G11C 5/04; G11C 8/00
[52] U.S. Cl. ..................................... 395/400; 395/425; 365/52; 365/63; 365/230.03; 364/DIG. 1
[58] Field of Search .............. 365/230.03, 52, 63, 365/230.01; 364/200 MS File, 900 MS File; 395/400, 425

[56] References Cited

U.S. PATENT DOCUMENTS

| | | | |
|---|---|---|---|
| 3,872,452 | 3/1975 | Stoops | 365/230.03 |
| 4,303,993 | 12/1981 | Panepinot, Jr. et al. | 365/230.03 |
| 4,319,343 | 3/1982 | Powell | 365/230.03 |
| 4,354,258 | 10/1982 | Sato | 365/230.03 |
| 4,400,794 | 8/1983 | Koos | 365/63 |
| 4,592,011 | 5/1986 | Mantellina et al. | 395/425 |
| 4,860,252 | 8/1989 | Sykora | 395/400 |
| 4,899,272 | 2/1990 | Fung et al. | 365/230.03 |

FOREIGN PATENT DOCUMENTS

| | | | |
|---|---|---|---|
| 0094564 | 7/1981 | Japan | 365/63 |
| 0180872 | 10/1984 | Japan | 365/230.03 |

*Primary Examiner*—Glenn Gossage
*Attorney, Agent, or Firm*—Staas & Halsey

[57] ABSTRACT

A memory apparatus including a back board having a lower address side and an upper address side, and a plurality of memory cards installed on the back board. Each memory card comprises a lower address side detecting signal pin for determining whether that memory card is installed on the lower address side of the back board, capacity detecting signal pins for notifying other memory cards of the capacity of that memory card, address signal pins, connected to an address signal line, and an address assigning circuit. When a memory card is installed on the lower address side of the back board, the capacity detecting signal pins and address signal pins assign an address to that memory card starting from a minimum address on the lower address side, and assign and address to another memory card which is installed on the upper address side starting with an address following the maximum address of the memory card installed on the lower address side.

8 Claims, 12 Drawing Sheets

| | | INPUT | | | | | | | OUTPUT | | | | |
|---|---|---|---|---|---|---|---|---|---|---|---|---|---|
| | | P1 | P4 | P5 | A24 | A23 | A22 | A21 | A20 | MA23 | MA22 | MA21 | MA20 | ACT |
| CASE1 (LOWER ADDRESS SIDE) | | 0 | | | 0..0 | 0..1 | 0..1 | 0..1 | 0..1 | 0..1 | 0..1 | 0..1 | 0..1 | 1 |
| | | | | | 1..1 | 0..1 | 0..1 | 0..1 | 0..1 | — | — | — | — | 0 |
| CASE2 (UPPER ADDRESS SIDE) | A | 1 | 0 | 0 | 0..0 | 0..0 | 0..0 | 0..0 | 0..1 | — | — | — | — | |
| | | | | | 0..1 | 0..0 | 0..0 | 1..0 | 0..1 | 0..1 | 0..1 | 0..1 | 0..1 | 1 |
| | | | | | 1..1 | 0..1 | 0..1 | 1..1 | 0..1 | — | — | — | — | 0 |
| CASE3 | B | | 0 | 1 | 0..0 | 0..0 | 0..0 | 0..1 | 0..1 | — | — | — | — | |
| | | | | | 0..1 | 0..0 | 1..0 | 0..1 | 0..1 | 0..1 | 0..1 | 0..1 | 0..1 | 1 |
| | | | | | 1..1 | 0..1 | 1..1 | 0..1 | 0..1 | — | — | — | — | 0 |
| CASE4 | C | | 1 | 0 | 0..0 | 0..0 | 0..1 | 0..1 | 0..1 | — | — | — | — | |
| | | | | | 0..1 | 1..0 | 0..1 | 0..1 | 0..1 | 0..1 | 0..1 | 0..1 | 0..1 | 1 |
| | | | | | 1..1 | 1..1 | 0..1 | 0..1 | 0..1 | — | — | — | — | 0 |
| CASE5 | D | | 1 | 1 | 0..0 | 0..1 | 0..1 | 0..1 | 0..1 | — | — | — | — | |
| | | | | | 1..1 | 0..1 | 0..1 | 0..1 | 0..1 | 0..1 | 0..1 | 0..1 | 0..1 | 1 |

| | | INPUT | | | | | | | | OUTPUT | | | | |
|---|---|---|---|---|---|---|---|---|---|---|---|---|---|---|
| | P1 | P4 | P5 | A24 | A23 | A22 | A21 | A20 | MA23 | MA22 | MA21 | MA20 | ACT | |
| LOWER ADDRESS SIDE | 0 | | | 0⋮0 | 0⋮0 | 0⋮0 | 0⋮1 | 0⋮1 | 0⋮0 | 0⋮1 | 0⋮1 | 0⋮1 | 1 | |
| | | | | 0⋮1 | 1⋮1 | 0⋮1 | 0⋮1 | 0⋮1 | − | − | − | − | 0 | |
| UPPER ADDRESS SIDE | 1 | 0 | 0 | 0⋮0 | 0⋮0 | 0⋮0 | 0⋮0 | 0⋮1 | − | − | − | − | 0 | } A |
| | | | | 0⋮0 | 0⋮1 | 0⋮0 | 1⋮0 | 0⋮1 | 0⋮0 | 0⋮1 | 0⋮1 | 0⋮1 | 1 | |
| | | | | 0⋮1 | 1⋮1 | 0⋮1 | 1⋮1 | 0⋮1 | − | − | − | − | 0 | |
| | | 0 | 1 | 0⋮0 | 0⋮0 | 0⋮0 | 0⋮1 | 0⋮1 | − | − | − | − | 0 | } B |
| | | | | 0⋮0 | 0⋮1 | 1⋮0 | 0⋮1 | 0⋮1 | 0⋮0 | 0⋮1 | 0⋮1 | 0⋮1 | 1 | |
| | | | | 0⋮1 | 1⋮1 | 1⋮1 | 0⋮1 | 0⋮1 | − | − | − | − | 0 | |
| | | 1 | 0 | 0⋮0 | 0⋮0 | 0⋮0 | 0⋮1 | 0⋮1 | − | − | − | − | 0 | } C |
| | | | | 0⋮0 | 1⋮1 | 0⋮1 | 0⋮1 | 0⋮1 | 0⋮0 | 0⋮1 | 0⋮1 | 0⋮1 | 1 | |
| | | | | 1⋮1 | 0⋮1 | 0⋮1 | 0⋮1 | 0⋮1 | − | − | − | − | 0 | |
| | | 1 | 1 | 0⋮0 | 0⋮1 | 0⋮1 | 0⋮1 | 0⋮1 | − | − | − | − | 0 | } D |
| | | | | 1⋮1 | 0⋮0 | 0⋮1 | 0⋮1 | 0⋮1 | 0⋮0 | 0⋮1 | 0⋮1 | 0⋮1 | 1 | |
| | | | | 1⋮1 | 1⋮1 | 0⋮1 | 0⋮1 | 0⋮1 | − | − | − | − | 0 | |

Fig. 4C

| | | | INPUT | | | | | | OUTPUT | | | | |
|---|---|---|---|---|---|---|---|---|---|---|---|---|---|
| | P1 | P4 | P5 | A24 | A23 | A22 | A21 | A20 | MA23 | MA22 | MA21 | MA20 | ACT |
| LOWER ADDRESS SIDE | 0 | | | 0..0 | 0..0 | 0..0 | 0..1 | 0..1 | 0..0 | 0..0 | 0..1 | 0..1 | 1 |
| | | | | 0..1 | 0..1 | 1..1 | 0..1 | 0..1 | — | — | — | — | 0 |
| UPPER ADDRESS SIDE | 1 | 0 | 0 | 0..0 | 0..0 | 0..0 | 0..0 | 0..1 | — | — | — | — | (A) |
| | | | | 0..0 | 0..0 | 0..1 | 1..0 | 0..1 | 0..0 | 0..0 | 0..1 | 0..1 | 1 |
| | | | | 0..1 | 0..1 | 1..1 | 1..1 | 0..1 | — | — | — | — | 0 |
| | | 0 | 1 | 0..0 | 0..0 | 0..0 | 0..0 | 0..1 | — | — | — | — | (B) |
| | | | | 0..0 | 0..0 | 1..1 | 0..1 | 0..1 | 0..0 | 0..0 | 0..1 | 0..1 | 1 |
| | | | | 0..1 | 1..1 | 0..1 | 0..1 | 0..1 | — | — | — | — | 0 |
| | | 1 | 0 | 0..0 | 0..0 | 0..1 | 0..1 | 0..1 | — | — | — | — | (C) |
| | | | | 0..0 | 1..1 | 0..0 | 0..1 | 0..1 | 0..0 | 0..0 | 0..1 | 0..1 | 1 |
| | | | | 0..1 | 1..1 | 1..1 | 0..1 | 0..1 | — | — | — | — | 0 |
| | | 1 | 1 | 0..0 | 0..1 | 0..1 | 0..1 | 0..1 | — | — | — | — | (D) |
| | | | | 1..1 | 0..0 | 0..0 | 0..1 | 0..1 | 0..0 | 0..0 | 0..1 | 0..1 | 1 |
| | | | | 1..1 | 0..1 | 1..1 | 0..1 | 0..1 | — | — | — | — | 0 |

Fig. 4D

|  |  | INPUT |  |  |  |  |  |  | OUTPUT |  |  |  |  |  |
|---|---|---|---|---|---|---|---|---|---|---|---|---|---|---|---|
|  |  | P1 | P4 | P5 | A24 | A23 | A22 | A21 | A20 | MA23 | MA22 | MA21 | MA20 | ACT |  |
| LOWER ADDRESS SIDE | | 0 | | | 0...0 | 0...0 | 0...0 | 0...0 | 0...1 | 0...0 | 0...0 | 0...0 | 0...1 | 1 | |
| | | | | | 0...1 | 0...1 | 0...1 | 1...1 | 0...1 | — | — | — | — | 0 | |
| UPPER ADDRESS SIDE | | 1 | 0 | 0 | 0...0 | 0...0 | 0...0 | 0...0 | 0...1 | — | — | — | — | | A |
| | | | | | 0...0 | 0...0 | 0...0 | 1...1 | 0...1 | 0...0 | 0...0 | 0...0 | 0...1 | 1 | |
| | | | | | 0...1 | 0...1 | 1...1 | 0...1 | 0...1 | — | — | — | — | 0 | |
| | | | 0 | 1 | 0...0 | 0...0 | 0...0 | 0...1 | 0...1 | — | — | — | — | | B |
| | | | | | 0...0 | 0...0 | 1...1 | 0...1 | 0...1 | 0...0 | 0...0 | 0...0 | 0...1 | 1 | |
| | | | | | 0...1 | 0...1 | 1...1 | 1...1 | 0...1 | — | — | — | — | 0 | |
| | | | 1 | 0 | 0...0 | 0...0 | 0...1 | 0...1 | 0...1 | — | — | — | — | | C |
| | | | | | 0...0 | 1...1 | 0...0 | 0...0 | 0...1 | 0...0 | 0...0 | 0...0 | 0...1 | 1 | |
| | | | | | 0...1 | 1...1 | 0...1 | 1...1 | 0...1 | — | — | — | — | 0 | |
| | | | 1 | 1 | 0...0 | 0...1 | 0...1 | 0...1 | 0...1 | — | — | — | — | | D |
| | | | | | 1...1 | 0...0 | 0...0 | 0...0 | 0...1 | 0...0 | 0...0 | 0...0 | 0...1 | 1 | |
| | | | | | 1...1 | 0...1 | 0...1 | 1...1 | 0...1 | — | — | — | — | 0 | |

EXPLANATION OF SIGNALS

CASE1 ··· MEMORY CARD IS CONNECTED ON LOWER ADDRESS SIDE

CASE2 ··· MEMORY CARD OF 2MBYTE IS CONNECTED ON THE LOWER ADDRESS SIDE

CASE3 ··· MEMORY CARD OF 4MBYTE IS CONNECTED ON THE LOWER ADDRESS SIDE

CASE4 ··· MEMORY CARD OF 8 MBYTE IS CONNECTED ON THE LOWER ADDRESS SIDE

CASE5 ··· THE MEMORY CARD OF 16MByte IS CONNECTED ON THE LOWER ADDRESS SIDE

① IN CASE WHERE AT LEAST
ONE OF A21~A23 IS '1' AND A24='0'

| A24 | A23 | A22 | A21 |
|-----|-----|-----|-----|
| 0   | 0   | 0   | 1   |
| 0   | 0   | 1   | 0   |
| 0   | 0   | 1   | 1   |
| 0   | 1   | 0   | 0   |
| 0   | 1   | 0   | 1   |
| 0   | 1   | 1   | 0   |
| 0   | 1   | 1   | 1   |

} ACT='1'

*Fig. 8A*

② IN CASE A21=A22=A23='0'
AND A24='1'

| A24 | A23 | A22 | A21 |
|-----|-----|-----|-----|
| 1   | 0   | 0   | 0   |

} ACT='1'

*Fig. 8B*

MEMORY APPARATUS COMPRISING MEMORY CARDS WITH A SIDE DETECTING SIGNAL PIN AND ADDRESS ASSIGNMENT CIRCUITRY

This application is a continuation of application Ser. No. 07/495,984, filed Mar. 20, 1990, now abandoned.

BACKGROUND OF THE INVENTION

The present invention relates to a memory apparatus comprising at least two memory cards inserted into a back board. Such a memory apparatus has a relatively small capacity and addresses must be continuously assigned to respective memory cards. The back board includes an address bus with a memory card on which a semiconductor memory comprising one chip or a plurality of chips and a peripheral circuit are provided. The memory apparatus generally uses two memory cards, each having the same capacity. Therefore, by using the upper-most bit of the address, one of the two memory cards can be selected and accessed, thereby performing contiguous address assignment.

For example, respective address circuits of the memory cards are formed such that a memory card on the lower address side can be accessed when the upper-most bit of the address is "0" and a memory card of the higher address side can be accessed when the upper-most bit of the address is "1". The memory cards are installed in a back board.

When various memory cards with various discretional capacities are combined and installed, it is necessary in the prior art when performing a contiguous address assignment that the address of the respective memory cards be manually and previously set by a user using switches. The user determines which memory card is on the lower address side and which memory card is on the upper address side, and the user detects the capacity of the memory card on the lower address side so that the memory card on the upper address side has as the minimum address the address following the maximum address of the memory card on the lower address side.

Therefore, before the memory card is installed in a back board, the address assignment must be set by the user as described above, thus complicating the handling of the memory cards. If the installing position of the memory card is wrong, it causes the continuity of the address to be lost and will not operate as a memory apparatus with the desired capacity.

SUMMARY OF THE INVENTION

An object of the present invention is to automatically form a contiguous address assignment even if two memory cards with different capacities are installed.

A feature of the present invention resides in a memory apparatus having a plurality of memory cards on a back board. These memory cards comprise a lower address side detecting signal pin for determining whether one of the memory cards is installed on the lower address side of the back board. Capacity detecting signal pins notify the second memory card of the capacity of the first memory card, and address signal pins are connected to address signal lines. An address assigning unit is connected to the lower address side detecting signal pin, the capacity detecting signal pins and the address signal pins. The address assigning unit either assigns to a memory card an address starting from the minimum address when the memory card is installed on the lower address side, or assigns to the memory card an address starting with the address following the maximum address of the memory card installed on the lower address side on the upper address side.

BRIEF DESCRIPTION OF THE DRAWINGS

FIGS. 4A to 4D show input and output relations in an address assigning circuit according to the first embodiment of the present invention, FIGS. 8A and 8B show the relation between an ACT signal and an address signal for CASE2 in which a 2-byte memory card is installed on the lower address side.

DESCRIPTION OF THE PREFERRED EMBODIMENTS

Figure 1:
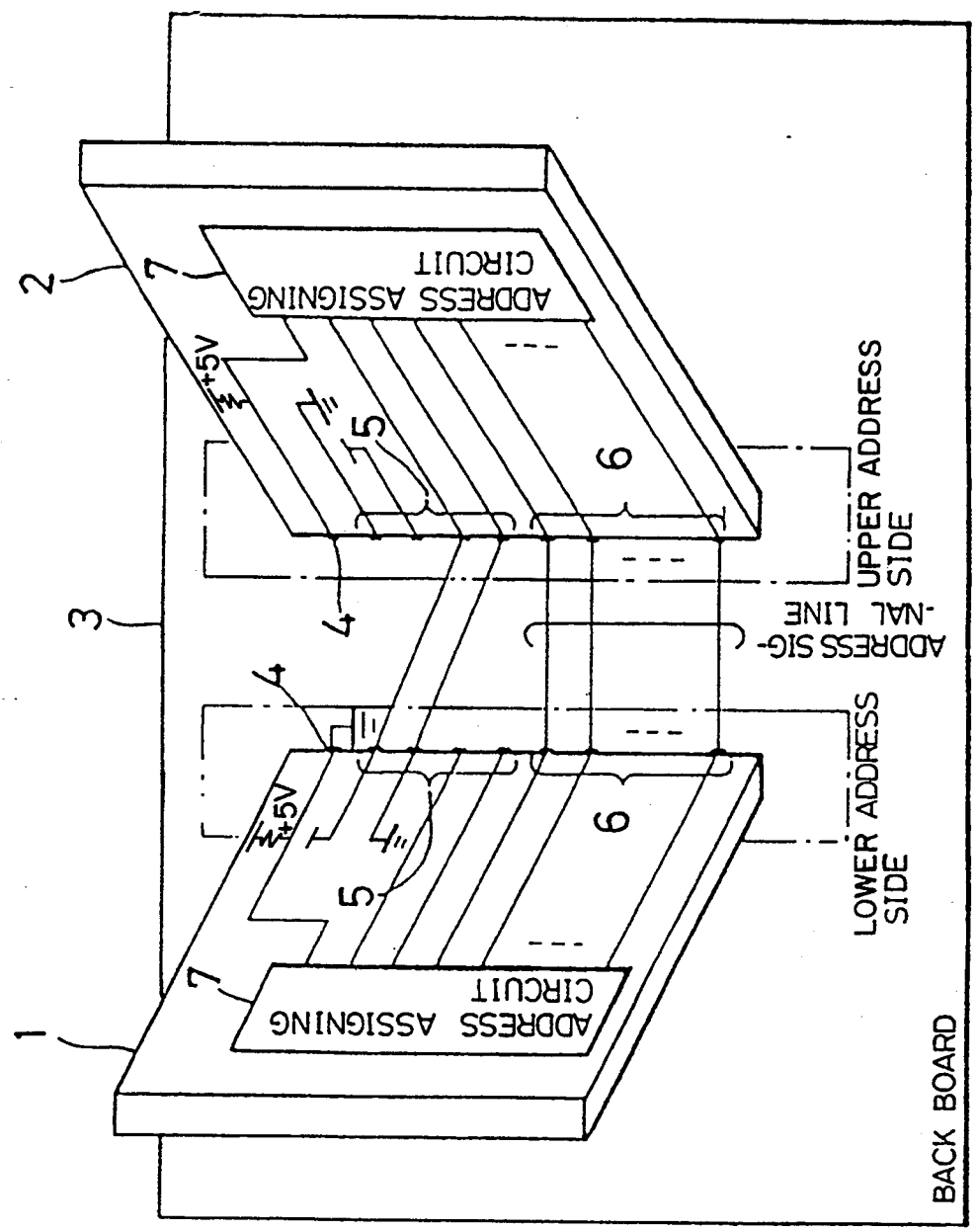
FIG. 1 is a block diagram for explaining the principle of the present invention.

The memory apparatus of the present invention is formed by the memory cards and will be explained by referring to FIG. 1.

Two memory cards 1 and 2 are installed in a back board 3 to form a memory apparatus. A lower address side detecting signal pin 4 detects whether or not memory cards 1 or 2 are installed on the lower address side of the back board 3. Capacity detecting signal pins 5 of a first memory card notifies a second memory card of the capacity of the installed first memory card, and address signal pins 6 connect the address signal lines to address assigning circuits 7. Signal pins 4, 5, and 6 are connected to address assigning circuit 7. When a memory card is installed on the lower address side, address assignment is conducted starting with the minimum address. When the memory card is installed on the upper address side, address assignment is conducted starting with the address following the maximum address of the memory card installed on the lower address side. An address assigning circuit 7 is provided in both memory cards 1 and 2.

When a memory card is installed on the lower address side, lower address side detecting signal pin 4 is at a low level "0" and when a memory card is installed on the upper address side, lower address side detecting signal pin 4 is at a high level "1". Address assigning circuit 7 can detect whether the memory card is installed on the lower address side or on the upper address side.

Capacity detecting signal pin 5 detects a signal representing a capacity of a first memory card by using two bits and notifies a second memory card of this capacity. The memory card installed on the upper address side can detect the capacity of the memory card installed on the lower address side by using the address assigning circuit 7. The address signal applied through the address signal line can be assigned starting with the address immediately following the maximum address of the memory card installed on the lower address side. Therefore, by merely installing the memory card into back board 3, address assignment becomes possible in accordance with the capacity of the particular memory cards.

Figure 2:
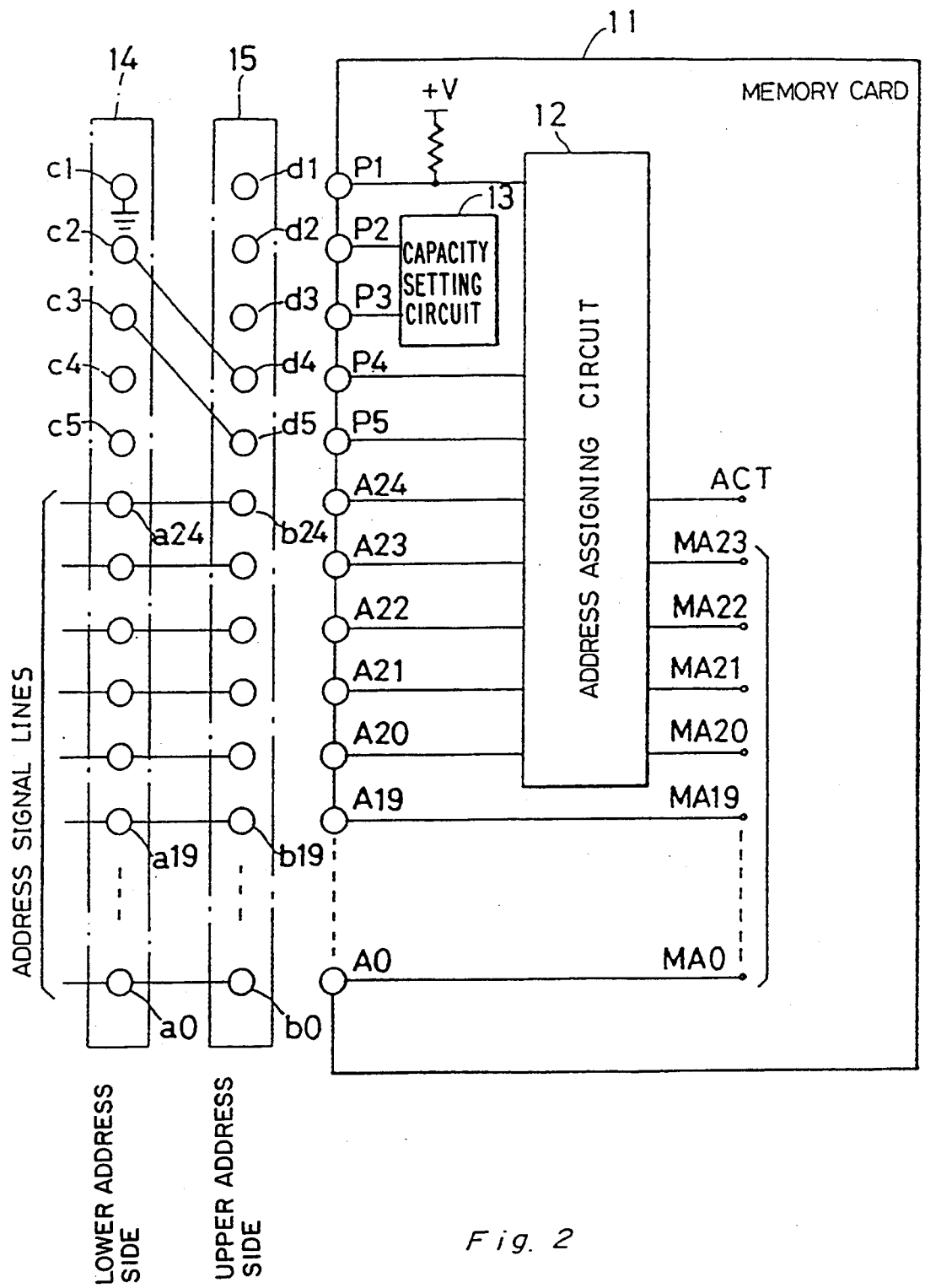
FIG. 2 is a block diagram for explaining an embodiment of the present invention.

FIG. 2 shows an embodiment of the present invention. This embodiment comprises memory card 11, address assigning circuit 12, capacity setting circuit 13, lower address side detecting signal pin P1, capacity detecting signal pins P2, P3, P4 and P5, address signal pins A0 to A24, memory address signals MA0 to MA23, and a signal ACT for enabling the memory to be in an operating state. The memory itself is not shown. Voltage source +V is applied to lower address detecting signal pin P1 through voltage source pin (not shown) and a register.

The embodiment further comprises connectors 14 and 15 for the lower address side and the upper address side of the back board respectively, contact portions a0 to a24 and b0 to b24 for connecting the address signal lines and for insertion of address signal pins A0 to A24 of memory card 11, into one set of contact portions, and contact portions c1 to c5 and d1 to d5 for insertion of signal pins P1 to P5 of the memory card 11 into another set of contact portions. Contact portion c1 is grounded to represent the lower address side and contact portion d1 is open to represent the upper address side. Contact portions c2 and d4, c3 and d5 are connected to each other and the capacity of the memory card installed on the lower address side is detected by the memory card installed on the upper address side.

In this embodiment, address signal lines formed of 25 bits are provided on a back board, thereby enabling access to a memory area of 32 Mbyte. Address assigning circuit 12 is connected to lower address side detecting signal pin P1, capacity detecting Signal pins P4 and P5 and address signal pins A20 to A24, thereby outputting an signal ACT and the upper 4 bits MA20 to MA23 of the memory address signal. The address assigning circuit 12 may be formed of read only memory (ROM) or a logic gate circuit. The lower 20 bits A0 to A19 of the address signal become memory address signals MA0 to MA19 without being modified. Capacity setting circuit 13 sets the capacity detecting signal pins P2 and P3 at high levels or low levels in accordance with the memory capacity provided on memory card 11.

The above explanation is not related to a data terminal or read/write terminal, but a data terminal can of course be provided. When the ACT signal is "1" the memory is made active and the data is subjected to a read/write operation.

FIGS. 3A to 3D are explanatory views of the memory card of an embodiment of the present invention. Pins P2 and P3 show capacity setting circuit 13 for the cases where K, L, M, N byte memories, respectively, are provided on the memory card. Signal pins P2 and P3 are grounded or connected to voltage source +V through a voltage source pin (not shown). Therefore, they become "0" and "0" in the case of K bytes, "0" and "1" in the case of L bytes, "1" and "0" in the case of M bytes, and "1" and "1" in the case of N bytes. Where the memory area of 32 M bytes can be accessed, K, L, M, and N may be set as 2, 4, 8 and 16 M bytes.

Memory capacity information set by capacity setting circuit 13 is transmitted from signal pins P2 and P3 to signal pins P4 and P5 of the memory card installed on connector 15 of the upper address side when memory card 11 is installed on connector 14 of the lower address side as shown in FIG. 2.

FIGS. 4A to 4D are views for explaining the input and output of an address assigning circuit of an embodiment of the present invention. FIG. 4A shows the case where a memory card of 16 Mbytes is used. When this memory card is installed on the upper address side, the capacities of the memory cards installed on the lower address side are 2, 4, 8 and 16 Mbytes, respectively, as shown in rows A, B, C and D. P1, P4, P5 and A24 to A20 are used for addresses. Signals MA23 to MA20, and ACT are only able to be read thereby indicating a read only memory (ROM).

When a memory card of 16 M bytes is installed in connector 14 on the lower address side, the signal pin P1 connected to address assignment circuit 12 receives "0" input because contact portion c1 of lower address side connector 14 is grounded. Contact portions c4 and c5 of lower address side connector 14 are open and address signal pins A24 to A20 are connected to address assigning circuit 12, thereby providing the input state shown in the row for the lower address side, as shown in FIG. 4A. The address signals A0 to 19 represent 1 Mbytes, the address signal A20 represents 2 Mbytes, the address signal A21 represents 4 Mbytes, the address signal A22 represents 8 Mbytes and the address signal A23 represents 16 Mybtes.

Accordingly, where the memory card comprises 16 Mbytes and thus the address signal (address signal pins) of the upper 5 bits A24 to A20 are "00000" to "01111" the output signal ACT is "1" and the upper 4 bits of the memory address signal MA23 to MA20 are "0000" to "1111". If the upper-most bit A24 of the address signal is "1", the signal ACT becomes "0" because the memory card on the lower address side does not have the address corresponding to the address signal A24. Instead of the memory card installed on the lower address side, the memory card installed on the upper address side is accessed in a scope of the upper 5 bits of address signals A24 to A20 of "10000" to "11111".

Figure 3A:
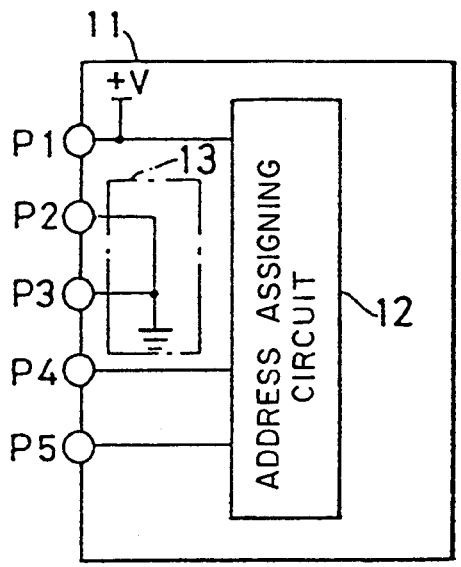
FIGS. 3A to 3D are block diagrams of the memory card of the present embodiment.

When a memory card of 16 Mbytes is installed on the upper address side, lower address providing detecting signal pin P1 becomes "1" because contact portion c1 of upper address circuit connector 15 is open. If a 2-Mbyte memory card is installed on the lower address side, capacity setting circuit 13 is set as shown in FIG. 3A, with the signal pins P4 and P5 of the memory card installed on the upper address side being "0" and "0" as shown in a row A of FIG. 4A.

In this case, the capacity of the memory card installed on the lower address side is 2 Mybtes. The memory card installed on the lower address side is accessed where the upper 5 bits of address signal A24 to A20 are in a range of "00000" to "00001" and the signal ACT becomes "0". If the memory card or the upper address side is accessed where the upper 5 bits of address signal A24 to A20 are in range of "00010" to "10001" the signal ACT becomes "1" as the "10001" is obtained by adding "1111" (16 Mbyte memory card) to "00010". If the address signal is more than the address "10010" the signal ACT becomes "0". Accordingly, a memory apparatus of 18 Mbytes is formed, enabling a contiguous address assignment to be applied to the memory card installed on the lower address side and the memory card installed on the upper address side.

Figure 3C:
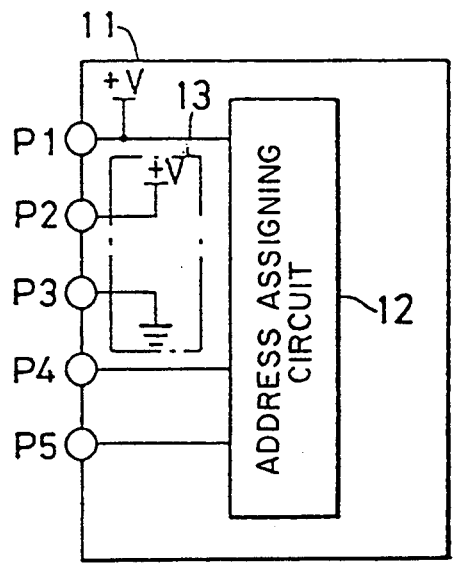
Figure 3B:
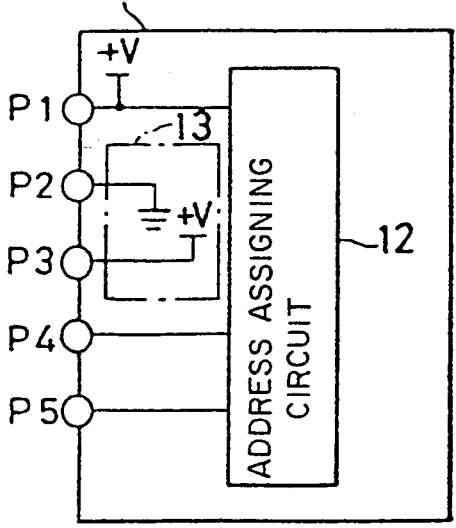

When the capacity of the memory card installed on the lower address side is 4 Mbytes, the capacity setting circuit 13 is set as shown in FIG. 3B. Thus, signal pins P4 and P5 of the memory card installed on the upper address side are "0" and "1" and the input-output relationship of address assigning circuit 12 is as shown in row B of FIG. 4A. Namely, when address signals A24 to A20 are "00100" to "10011" the signal ACT becomes "1" as the memory card on the upper address side has 16 Mbytes ("1111"). If address signals A24 to A20 are outside this range, the signal ACT becomes "0". Accordingly, a memory apparatus of 20 Mbytes can be formed.

When the capacity of the memory card installed on the lower side is 8 Mbytes, capacity setting circuit 13 is set as shown in FIG. 3C. Signal pins P4 and P5 of the memory card installed on the upper address side are "1" and "0", respectively, and the input-output relationship of address assigning circuit 12 is as shown in row C of FIG. 4A. Namely, in a range in which the address signals A24 to A20 are "01000" to "10111" the signal ACT becomes "1" and if the address signals A24–A20 are outside this range, the signal ACT becomes "0". Therefore, a memory apparatus of 24 Mbytes can be formed.

Figure 3D:
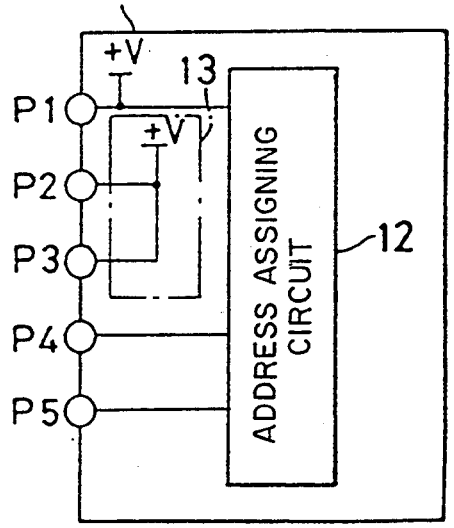

The capacity of the memory card installed on the lower address side is 16 Mbyte, i.e., the same as that of the memory card installed on the upper address side. When capacity setting circuit 13 is set as shown in FIG. 3D, signal pins P4 and P5 of the memory card installed on the upper address side become "1" and "1". Thus, the input-output relation of address assigning circuit 12 becomes as shown in row D of FIG. 4A. If the address signal 24 to A20 is between "10000" to "11111" the signal ACT becomes "1" and if otherwise, it becomes "0". Therefore, the memory card installed on the lower address side and the memory card installed on the upper address side are accessed by a contiguous address assignment. A memory apparatus of 32 Mbytes can thus be formed.

FIGS. 4B, 4C and 4D designate an input and output relationship of an address assigning circuit for 8M, 4M and 2M memory cards respectively. FIG. 4A recited above represents a 16M memory card. For the lower address, addresses MA23 to MA20 of 16 Mbytes are "0000" to "0111". For the upper address, the address of 16 Mbytes is added to the lower address, thereby providing a related range of addresses. For 8M, 4M and 2M memory cards, the same method applies. If the memory card is installed on the lower address side, the memory is made active (an act signal=1) within the range of 8M, 4M and 2M memory cards. If the memory card is installed on the upper address, the addresses of 8M, 4M and 2M bytes are added to the lower address to provide a certain range of addresses.

Figure 5:
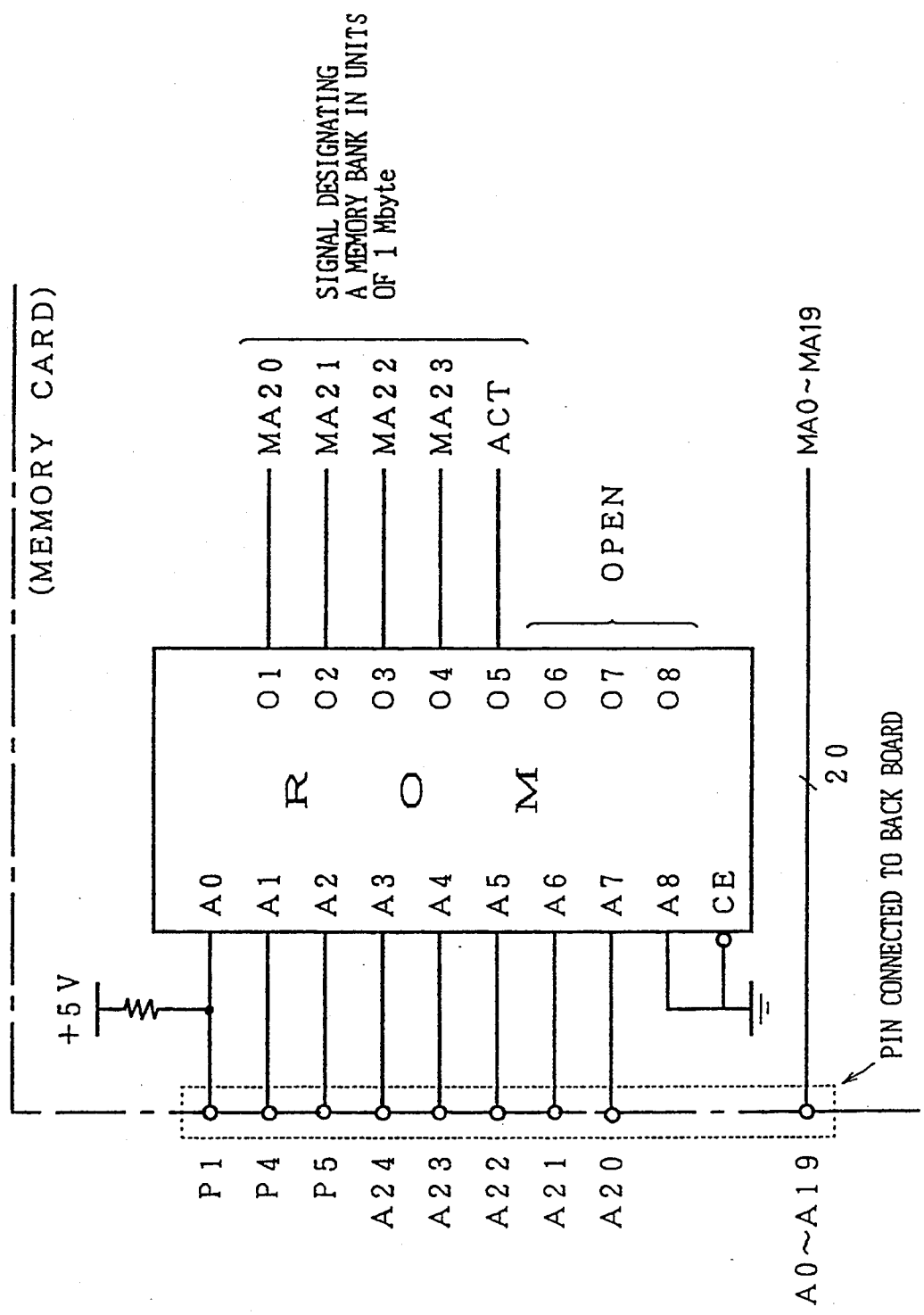
FIG. 5 shows an address assigning circuit of the first embodiment of the present invention in which a read-only memory ROM is used.

In the above recited embodiment, address assigning circuit 12 is formed by a ROM and P1, P4, P5 and A24 to A20 are added to the ROM as addresses. The output shown in FIGS. 4A to 4D are stored in accordance with the determined memory capacity and an objective value is outputted in accordance with a condition of the input addresses. Namely, as shown in FIG. 5, P1, P4, P5 and A24 to A20 are added to the address terminals A0 to A7 of the ROM address terminal and data terminals $0_1$ to $0_5$ to produce the output signal MA20 to MA23 and ACT. The ROM shown in FIG. 5 is a memory of 512 bytes but address terminal A8 is not necessary. Chip enable CE terminal is grounded. Therefore, an address assigning circuit can be formed by a ROM having a small capacity. At this time, output signal MA20 to MA23 can designate a memory bank in 1-Mbyte units.

Address assigning circuit 12 in FIG. 5 is formed by a ROM but may be formed by other circuits. For example, input addresses A24 and A23 are input to a subtractor and where the memory card is installed on the lower address side (P1=0), 0 is subtracted. When the other memory card is installed on the upper address side (P1=1), when P4=0 and P5=0, 2 is subtracted; when P4=0 and P5=1, 4 is subtracted; when P4=1 and P5=0, 8 is subtracted; and when P4=1 and P5=1, 16 is subtracted. When the results obtained by these subtractions are negative (namely, the address does not exist on the upper address side but does exist on the lower address side) the memory capacity of the memory card is exceeded on the upper address side.

Figure 6:
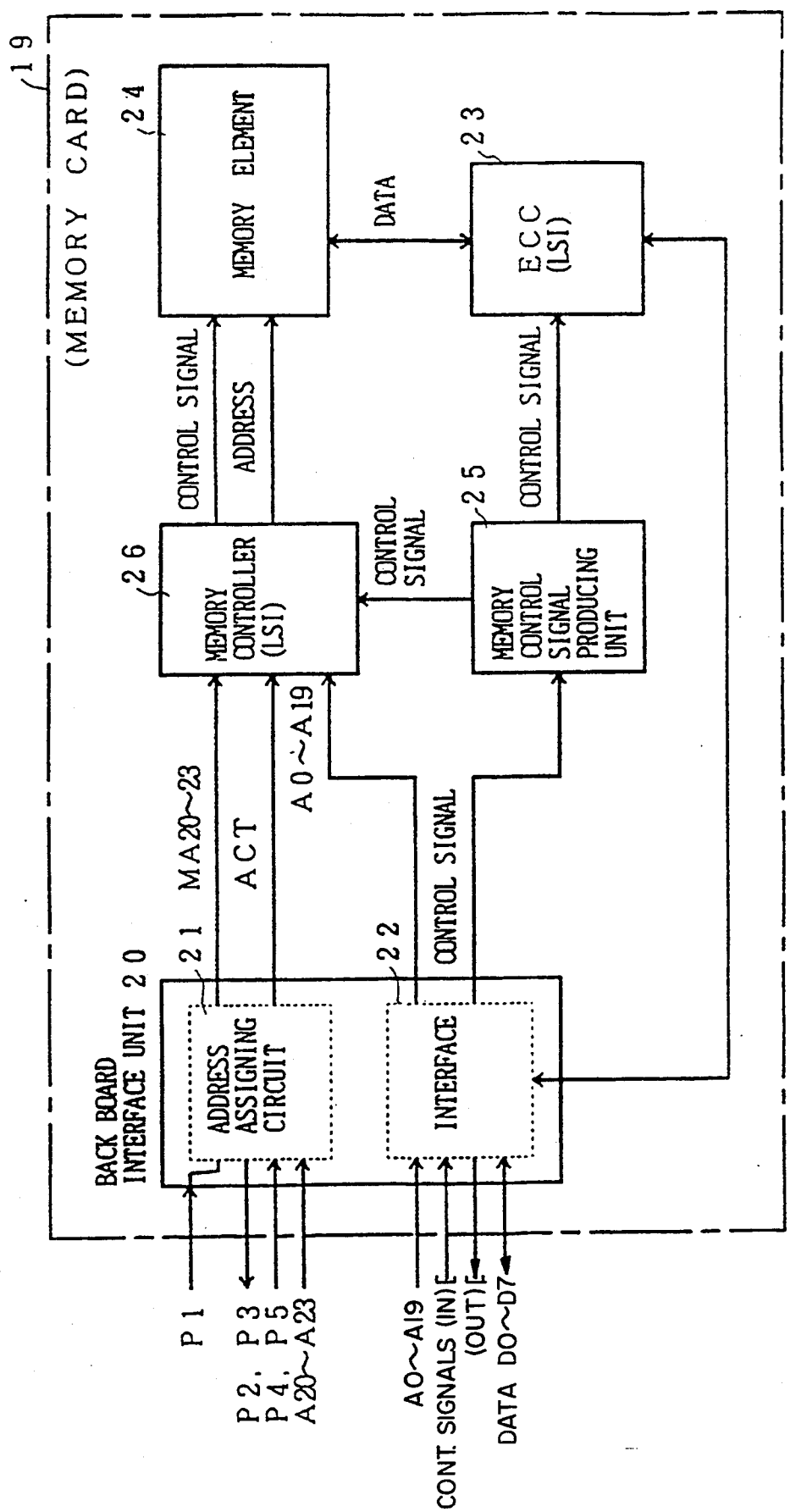
FIG. 6 shows a block diagram of a memory card according to the present invention.

FIG. 6 is a block diagram of the memory card of the second embodiment.

Back board interface 20 comprises an address assigning circuit 21 and interface portion 22. Address assigning circuit 21 comprises a ROM. As recited above, the capacity of the memory card can be outputted based on the value of the state of P2 and P3. If capacity signals P1, P4 and P5 are connected to addresses A20 to A23, they produce upper addresses MA20 to MA23 of the memory in the memory card and active signal ACT. Interface 22 is provided with address terminals A0–A19 (pin), data terminals D0–D7 (pin) of the back board and a control signal terminal from the back board. A bidirectional buffer (not shown) is provided in interface 22 and upon writing, data is input to the memory side and upon reading, data is transferred to the back board side. The bidirectional buffer is connected to the data terminal of memory element 24 through ECC (error checking and correcting) circuit 23. ECC circuit 23 checks the data output from memory element 24 and data from the back board to determine whether the data is in error. If it is, ECC circuit 23 corrects the errors. For example, when the necessary data is received on D0 to D8, the data line for correcting the errors is also input. Though not shown in the drawing, the input data is corrected based upon data received through an error correcting data line. The memory element also has an area for correcting the error. The error is checked and corrected by ECC23. The ECC circuit is not directly related to the present invention. Thus, the data line is explained hereinafter based on the assumption that the number of data lines is 8 bits.

Interface 22 inputs the control signal transmitted from the back board into control signal producing unit 25. Based on this control signal, control signal producing unit 25 applies a special control signal to ECC 23 and memory controller 26. Upon writing, the data D0 to D7 applied through interface 22 is subject to a check and correct operation by ECC 23 under the control of the control signal applied through memory control signal producing unit 25 and is then stored in memory element 24. Upon storing the data in memory element 24, the write control signal from memory control signal producing unit 25 is applied to memory element 24 through memory controller 26. Memory element 24 stores the data transmitted through ECC 23 in accordance with the write control signal from memory controller 26. Upon reading the data, the read control signal produced from memory control signal producing unit 25 is applied to memory element 24 through memory controller 26. Then, memory element 24 outputs the stored data to ECC 23 under the control of the read control signal. ECC 23 performs a check and correct operation on the output data in accordance with the control signal produced from memory control signal producing unit 25. The result of this operation is outputted through interface. The above operation of memory card 19 is shown in FIG. 6. When the read data is written into or read from the memory element 24, it is necessary to designate a location (address) in the memory in which the data is stored or from which it is read. Address assigning circuit 21 and memory controller 26 produce such addresses. When memory capacity is fixed, the address value is not changed although addresses a0 to a19 are input through interface 22 and addresses a20 to a23 are input through address assigning circuit 21. Then the address value is applied to memory element 24 through a controller. When the addresses are provided on the lower address side, they are provided starting from the low address side. When they are provided on the upper address side, the address of the memory card starts from the address following the maximum address of the memory card provided on the low address side. Address assigning circuit 21 converts the input address into the address of memory element 24.

Address assigning circuit 21 converts the input address into the address of memory element 24. The addresses MA20 to MA23 assigned by assigning circuit 21 are applied to memory element 24 through memory controller 26. The low side addresses a0 to a19 are provided to memory element 24 through memory controller 26. Memory element 24 is accessed using addresses MA24 to MA20 and a19 to a0. Address assigning circuit 21 produces the signal ACT indicating that the memory element 24 of the memory card is designated and applied to memory controller 26. Memory controller 26 produces a control signal such as a write pulse or read pulse to be applied to memory element 24 by using control signals such as write enable, read enable and timing signals applied from memory control signal producing unit 25 and the signal ACT. Memory controller applies control signals to memory element 24 to perform one of a plurality of access operations to enable data D0 to D7 to be written into or read out of the memory element.

Figures 7A, 7C:
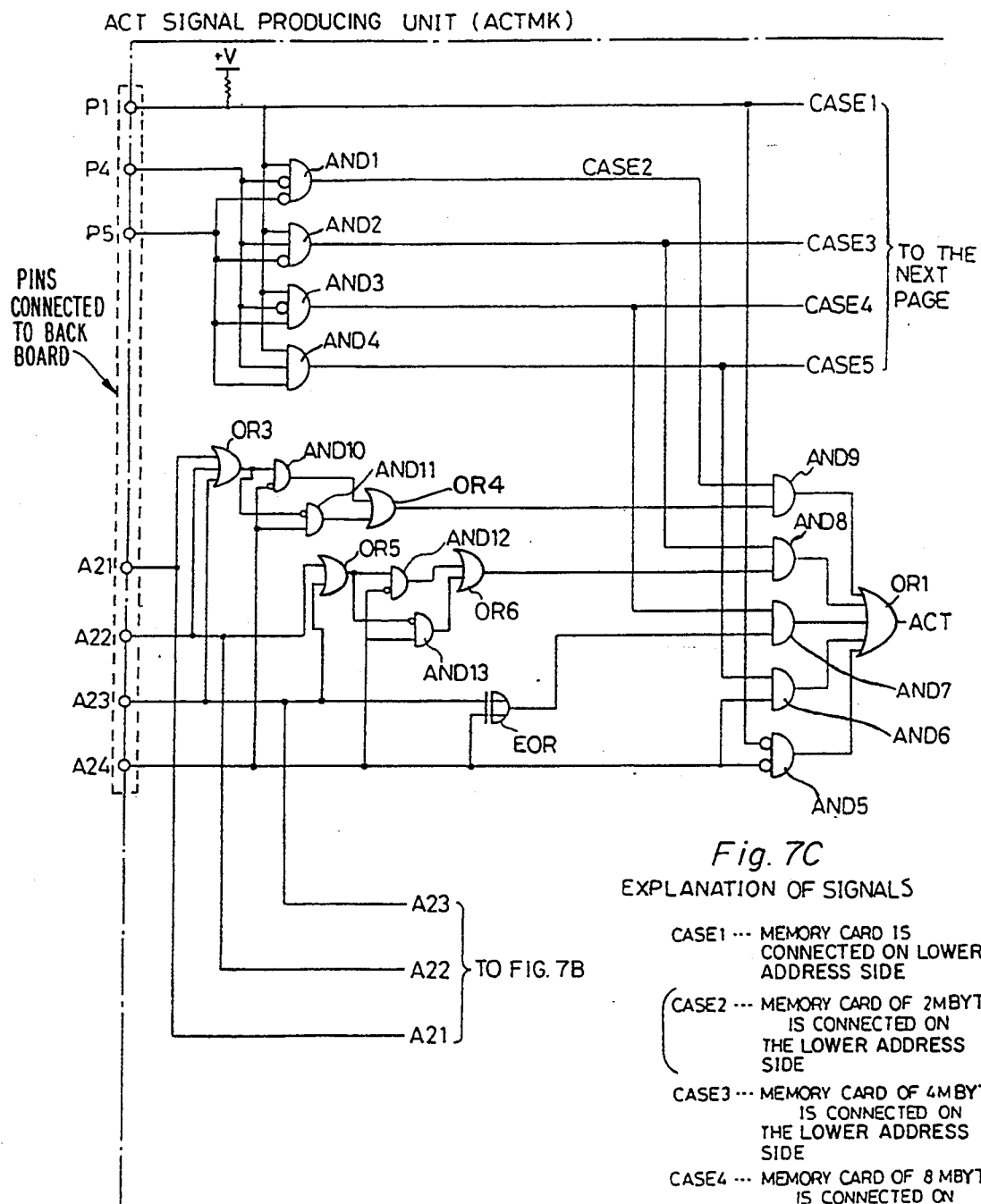
FIG. 7A is a circuit diagram of an ACT signal producing unit of the memory address assigning circuit of the second embodiment of the present invention.
Figure 7B:
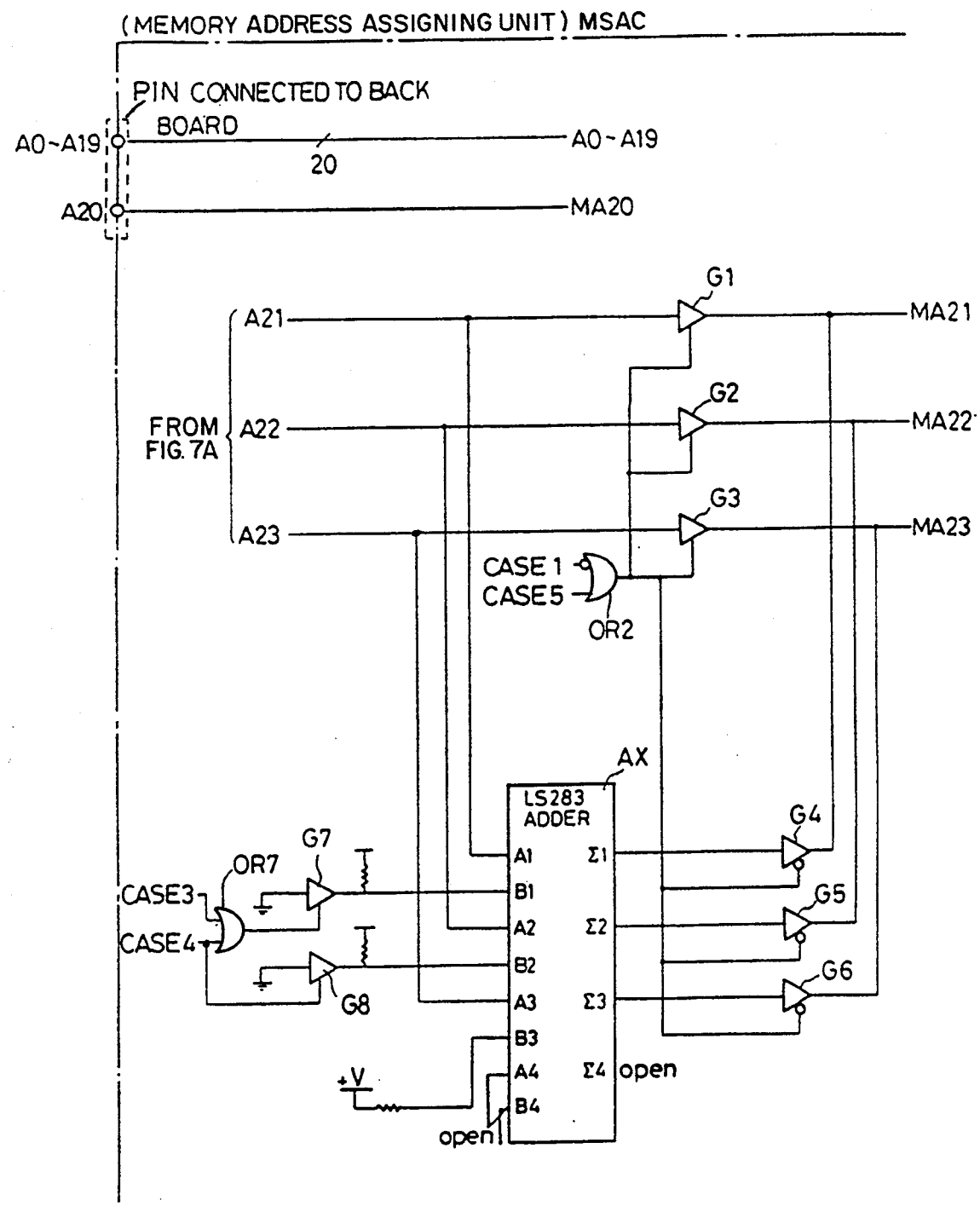
FIG. 7B is a circuit diagram of a memory assigning unit of the address assignment circuit of the second embodiment of the present invention.

FIGS. 7A and 7B show a detailed circuit of the detailed address assigning circuit according to the second embodiment of the present invention where a ROM is not used. FIG. 7A relates to the signal ACT producing unit and FIG. 7B relates to a memory assigning unit. Pins P4 and P5 to which signals representing the memory capacity are applied are connected to AND gates, AND D1 to AND D4, as shown in FIG. 7A. When P1 receives the signals representing the lower address side or the upper address side they are inputted to non-inverted input of AND gates AND1 and AND4. As recited above, when the memory card is inserted on the lower address side, the voltage at pin P1 is set at a low level. Thus, AND gates AND1 to AND4 produce low level signals, and this time the signal (CASE1) applied from the pin P1 is 0.

When the memory card is inserted on the upper address side, the pin P1 produces a "1" level signal. Thus, AND gates AND1 and AND4 are turned on and the capacity applied from the pins P4 and P5 is decoded. Namely, when P5x=0, P4x=0, CASE2=1 and other cases=0,
when P5x=0, P4x=1, CASE3=1 and other cases=0,
when P5x=1, P4x=0, CASE4=1 and other cases=0,
when P5x=1, P4x=1, CASE5=1 and other cases=0,
P4x and P5x represent the logical levels applied to the pins P4 and P5. One of the signals CASE3 to CASE5 becomes a "1" level in accordance with the combination signals applied to pins P1, P4 and P5, when the memory card is connected to the back board and the power is turned on. These logical levels are maintained as long as the power source is on.

When signal CASE1=0, the memory card is connected on a lower address side. In order to make the signal ACT "1" when addresses A24 to A21 are "00000" to "01111" the signal CASE1 and address 24 are applied to an inverted input of AND5. If A24=0 and CASE1=0, "1" is produced from OR gate OR1 as the signal ACT. At this time, when addresses A23 to A21 are applied to the memory element 24 without being modified, signal CASE1 is applied to inverted input of OR gate OR2, thereby turning gates G1 to G3 ion, i.e., transferring tri-state gate buffers G1 to G3 to the active state, as shown in FIG. 7B.

When the signal CASE2=1 a memory card of 2 Mbytes is connected on the lower address side, and addresses A24 to A21 are decoded by AND gates AND10, AND11 and OR gates OR3 and OR4, thereby enabling the signal ACT to "1" through AND gate AND9 and OR gate OR1, with AND gate AND9 being enabled by the signal CASE2=1. The ACT signal enables the objective address space of memory element 24 to be active. As shown in FIGS. 8A and 8B, the signal ACT is "1" when at least one of addresses A23 to A21 is "1" and address 24 is 0, or when addresses A23 to A21 are all 0 and address A24 is "1".

Similarly, when the signal CASE1=1 the input address signal route is decoded by AND gates AND12, AND13 and OR gates OR5 and OR6, thereby enabling the signal ACT to be "1" through AND gate AND8 and OR gate OR1, as AND gate AND8 is enabled by the signal CASE3.

When the CASE4=1, the input addresses are decoded by an exclusive OR gate EOR to which the addresses a23 and a24 are applied, enabling active signal ACT to be 1 through AND gate AND7 and OR gate OR1, AND gate AND7 being enabled because of CASE4.

Upon CASE5=1, when the address 24 is 1, enabling the active signal ACT to be "1" through AND gate AND6 and OR gate OR1.

As described above, the act signal generating unit ACTMK shown in FIG. 7A enables the signal ACT to be "1" for 16 Mbytes following the memory capacity connected to the lower address side.

In the embodiment of the present invention, the memory address of the memory card must be assigned to the address following the address of the memory card installed on the lower address side. This assignment is performed by memory address assigning unit MSAC shown in FIG. 7B. An explanation will now be made for the case when the memory card is connected to the lower address side.

When CASE5=1, addresses applied to the memory element will be similarly treated. Therefore, for CASE5=1, AND gates G1 to G3 through OR gate OR2 and addresses a23 to a21 are applied to addresses MA23 to MA21 of the memory element. In other cases, the output of OR gate OR2 is 0 and thus gates G1 to G3 are turned off and gates G4 to G6 (tri-state buffer) are turned on. The output of the address AX (LS283) is applied to the input of gates G4 to G6. Adder AX applies respective values to the addresses in accordance with the capacity of respective memory cards. When CASE2 equals 1 and then signals CASE3 and CASE4 equal 0, "111" is added to the address value. When CASE3 equals 1, gate G7 is turned on through OR gate OR7, and "110" is added to the address value. When the signal CASE4 equals 1, gates G7 and G8 are turned on and, "100" is added to the address value. This adder circuit AX provides addresses MA23 to MA21 which are applied to the memory element starting with (000) address. Thus, "001", "010" and "100" and so on are subtracted from the input address value.

The operation of the circuit for generating the memory inside address (MA21-MA23) shown in FIGS. 7A and 7B is summarized as follows. When signal CASE1=0, A23-A20 is made to correspond to MA23-MA20. When signal CASE2=1, "001" (B) is subtracted from A23-A21 (namely, "111" is added to A23-A21), A20 is made to correspond to MA20 without being modified. When signal CASE3=1, "010" (B) is subtracted from A23-A21 (namely, "110" is added to A23-A21). A21 and A20 are made to correspond to MA21 and MA20 without being modified. When signal CASE4=1, "100" (B) is subtracted from A23-A21 (namely, "100" is added to A23-A21). A22-A20 are made to correspond to MA22-MA20 without being modified. When signal CASE5=1, A23=A20 are made to correspond to MA23-MA20.

In accordance with the above operation shown in FIGS. 7A and 7B, the same output as ROM shown in FIG. 4A can be applied to the memory element.

In the second embodiment, a memory element having a capacity of 16 Mbytes is explained, but a memory card having another capacity may be similarly used by modifying the circuit.

The present invention is not limited to the above embodiments. When the minimum capacity of a memory card is less than 1Mbyte, an address signal including address signal a19 is input to address assigning circuit 12 and memory address signal MA19 is also outputted. Where a memory apparatus with a maximum capacity of 64 Mbytes is formed, an address signal may be formed of 26 bits and the input and output relation of the address assigning circuit 12 should be set in accordance with the number of bits of the address signal. When the capacities of the memory cards vary, the number of capacity detecting pins may increase.

As explained above, the present invention provides a memory apparatus formed by two memory cards 1 and 2 by providing an address assigning circuit 7 connected to lower address side detecting signal pin P1 and capacity detecting, signal pins 5 (P2 to P5) and address signal pins 6. It is determined based on "0" and "1" of the lower address detecting signal pin 4, whether or not the memory card is installed on the lower address side. When mounting the memory card in the upper address side, the capacity of the lower address installment memory card is detected by the capacity detecting signal pins 5 and address assigning circuit 7 assigns the address following the maximum address of the lower address side installed memory card to the memory card on the upper address side. Therefore, even if a discretional capacity of memory card is selected and installed, contiguous address assignment is automatically possible.

We claim:

1. A memory apparatus, comprising:
 a plurality of memory cards, each including:
  memory element means for storing data,
  side detecting signal pin means for receiving a side signal having at least two states, and
  address assignment means for determining whether a corresponding one of said memory cards is installed on one of a lower address side and an upper address side based on a state of the side signal received by a corresponding side detecting signal pin means;
 a data bus;
 an address bus; and
 a back board, having the lower address side and the upper address side, each of said memory cards installed on one of the lower address side and the upper address side, at least one of said memory cards installed on each of the lower address side and upper address side, and said back board connecting said memory cards via said data bus and said address bus.

2. The memory apparatus according to claim 1, wherein each of said memory cards further comprises:
 first memory capacity detecting signal pin means for receiving memory capacity information from a memory card which is installed on the lower address side; and
 second memory capacity detecting signal pin means for outputting the memory capacity information to another memory card which is installed on the upper address side.

3. The memory apparatus according to claim 1, wherein the address assignment means of each of said memory cards comprises:
 means for assigning an address of a memory card which is installed on the lower address side to start from a minimum address of the lower address side when the signal received by a corresponding side detecting signal pin means designates the lower address side, and for assigning an address of another memory card which is installed on the upper address side to start after a maximum address of the lower address side.

4. The memory apparatus according to claim 3, wherein each of said means for assigning an address comprises:
 a plurality of upper address lines of said address bus, and
 a read only memory for receiving memory capacity and address information of the memory element means from a first memory card which is installed on the lower address side and for storing an assigned address of the upper address side so that an address of the memory element means of a second memory card which is installed on the upper address side follows a maximum address of the first memory element means of the memory card installed on the lower address side.

5. The memory apparatus according to claim 1, wherein each of said memory cards further comprises:
 memory capacity detecting signal pin means for receiving a memory capacity signal representing a memory capacity of the lower address side, and
 wherein said address assignment means determines an address following a maximum address of the lower address side based on the memory capacity signal representing the memory capacity of the lower address side.

6. The memory apparatus according to claim 5, wherein the memory capacity signal comprises two bits representing a multiple of a base memory capacity of said memory cards, and where 00 represents the base memory capacity, 01 represents two times the base memory capacity, 10 represents four times the base memory capacity and 11 represents eight times the base memory capacity.

7. A memory apparatus, comprising:
a back board having a lower address side and an upper address side; and
a plurality of memory cards, each installed on one of the lower address side and the upper address side of said back board, at least one of the memory cards being installed on each of the lower address side and upper address side, each memory card comprising:
lower address side detecting signal means for determining whether a corresponding one of said memory cards is installed on the lower address side of said back board,
capacity detecting signal means for notifying other of said memory cards of a memory capacity of the corresponding memory card,
address signal means connected to an address signal line for generating an address signal, and
address assigning means connected to the lower address side detecting signal means, said capacity detecting signal means and said address signal means for assigning an address to a first memory card starting from a minimum address when installed on the lower address side, and assigning an address to a second memory card which is installed on the upper address side starting with an address following a maximum address of the first memory card installed on the lower address side.

8. A memory card for receiving data and inserted into a back board having a lower address side and an upper address side, said memory card comprising:
memory element means for storing the data;
side detecting signal pin means for receiving a side signal having at least two states; and
address assignment means for determining whether the memory card is installed on the lower address side or the upper address side of said back board based on a state of the side signal received by said pin means.

* * * * *